United States Patent
Pan et al.

(10) Patent No.: US 6,844,786 B2
(45) Date of Patent: Jan. 18, 2005

(54) MILLIMETER- AND SUBMILLIMETER-WAVE NOISE GENERATOR

(75) Inventors: Shing-Kuo Pan, Charlottesville, VA (US); Geoffrey A. Ediss, Charlottesville, VA (US); Anthony R. Kerr, Charlottesville, VA (US)

(73) Assignee: Associated Universities, Inc., Washington, DC (US)

( * ) Notice: Subject to any disclaimer, the term of this patent is extended or adjusted under 35 U.S.C. 154(b) by 90 days.

(21) Appl. No.: 09/932,977

(22) Filed: Aug. 21, 2001

(65) Prior Publication Data

US 2003/0038935 A1 Feb. 27, 2003

(51) Int. Cl.$^7$ .............................................. H03B 29/00
(52) U.S. Cl. ........................ 331/78; 324/637; 356/450; 342/156; 250/493.1
(58) Field of Search .............................. 331/78, 117 D, 331/96, 107 SL; 324/633, 637, 603, 317, 318; 342/156; 356/450; 250/493.1; 455/327, 67.4, 67.5

(56) References Cited

U.S. PATENT DOCUMENTS

| | | | |
|---|---|---|---|
| 2,658,992 A | | 11/1953 | Byrne .......................... 342/14 |
| 3,750,168 A | | 7/1973 | Schrader et al. ......... 342/455 X |
| 3,750,175 A | | 7/1973 | Lockerd et al. ............. 342/371 |
| 3,942,179 A | | 3/1976 | Dorn ............................ 342/14 |
| 4,219,885 A | | 8/1980 | Routh et al. .................... 367/1 |
| 4,521,861 A | * | 6/1985 | Logan et al. ................. 702/57 |
| 4,742,561 A | * | 5/1988 | Tipton ...................... 455/67.12 |
| 4,873,481 A | * | 10/1989 | Nelson et al. ............... 324/640 |
| 5,349,332 A | | 9/1994 | Ferguson et al. ......... 340/572.2 |
| 5,554,860 A | | 9/1996 | Seabaugh ..................... 257/25 |
| 5,631,489 A | * | 5/1997 | Roser .......................... 257/449 |
| 5,726,657 A | | 3/1998 | Pergande et al. ............ 342/202 |
| 5,777,572 A | | 7/1998 | Janusas ........................ 342/13 |
| 5,903,609 A | | 5/1999 | Kool et al. .................. 375/261 |
| 5,953,643 A | | 9/1999 | Speake et al. .............. 455/324 |
| 6,239,663 B1 | * | 5/2001 | Mizutani .............. 331/107 SL |
| 6,252,469 B1 | * | 6/2001 | Suematsu ............... 331/117 D |

OTHER PUBLICATIONS

A. R. Kerr, "Receiver noise temperature, the quantum noise limit, and the role of the zero–point fluctuations", 8th Int. Symp. on Space Terahertz Tech., Mar. 25–27, 1997, pp. 101–111.

* cited by examiner

Primary Examiner—Arnold Kinkead
(74) Attorney, Agent, or Firm—Morrison & Foerster LLP

(57) ABSTRACT

A noise generator for generating multi-octave, high-level, millimeter- and submillimeter-wave noise is disclosed. According to one embodiment of the invention, the noise generator includes: a microwave noise source; a microwave power-amplifier chain; a level-set attenuator; a frequency multiplier; and a transmission structure. The output of the generator has a high-intensity noise power spectrum over a frequency range from about 60 GHz to about 1 THz. This type of noise is particularly suited and has sufficient power for testing and calibrating millimeter- and submillimeter-wave components, devices, and circuits; material evaluation and characterization; and for use as a broadband millimeter- and submillimeter-wave noise source for a Fourier Transform Spectrometer.

36 Claims, 3 Drawing Sheets

MILLIMETER- AND SUBMILLIMETER-WAVE NOISE GENERATOR

FIELD OF THE INVENTION

The present invention relates to a method and apparatus for generating high level millimeter- and submillimeter-wave noise, particularly, noise in the frequency region between about 60 GHz and about 1 THz (~2 to 33 wave numbers), and to systems employing such a method and/or apparatus.

DESCRIPTION OF THE RELATED ART

Noise is commonly used in radio frequency ("RF") and microwave environments. For example, a radio frequency or microwave noise source can be used to characterize components and devices, evaluate a system's dynamic range and sensitivity, and tune the performance of a system. Further, powerful noise sources are often used in military jamming systems to disrupt or even destroy enemy radar or communication systems. Other noise applications include material characterization and evaluation in fields such as material science and biochemistry.

In the RF and microwave bands, conventional noise sources are typically constructed using noise tubes or solid-state noise diodes. Generally, noise tubes are high-voltage, gas-discharge tubes, wherein output noise is generated by an electric discharge in a gas, which is a random process. Although some noise tubes can generate noise slightly above 100 GHz with limited bandwidth, these tubes suffer from limitations, e.g., short lifetime, poor stability, and require very high voltages to operate. Currently, except in some very specific applications, noise tubes are no longer in wide use because they have been succeeded by more compact and reliable solid-state noise diodes, and in some special applications by thermal noise sources.

It is well known that when a diode, e.g., Zener diode or other semiconductor diode, is reverse-biased to a sufficiently high voltage, electrical breakdown occurs and a large reverse current flows. The breakdown mechanism is a combination of the processes of direct internal field emission (tunneling) and secondary ionization (avalanche). Because these processes generate many carriers at random, a high level of noise is produced. The major drawback of conventional noise diode technology is the inability to produce noise at high-frequencies. For example, the highest frequency achievable by present noise diode technology is nominally 110 GHz.

In the infrared and far-infrared frequency region, i.e., 500 GHz to 60 THz, thermal noise sources, such as high-pressure mercury arc lamps, are used as broadband noise sources, e.g., in Fourier Transform Spectrometry ("FTS") for measuring properties of materials, such as, dielectric and optical properties. A mercury arc lamp has a noise temperature, which is directly proportional to noise power per unit bandwidth, of approximately 2,000° K above 500 GHz. However, the noise power drops to a negligible and unsuitable level below this frequency. Mercury lamps also suffer from the disadvantages of, for example, stray UV light, limited stability, the requirement of high voltage and power to operate, and cooling means to dissipate large amounts of heat.

New developments in the space, military, and communications electronics industries have encouraged the use of millimeter- and submillimeter-wave components. Accordingly, millimeter and submillimeter-wave noise is needed to test and calibrate these components. Moreover, due to the recent expansion of the communications industry wherein the last of the available microwave bands have been allocated for communication purposes, it is likely that the industry in the near future will look to the 100 GHz to 1 THz range for additional communication channels. Subsequently, communication devices operating in such a range will require suitable noise to test the dynamic range and sensitivity of these communication devices. Presently, however, there are no noise sources that are able to provide sufficient noise power in or across a continuous range of frequencies in the region between about 100 GHz and about 1 THz.

Therefore, a need has arisen for a millimeter- and submillimeter-wave noise source having sufficient power covering the frequency range from 100 GHz to 1 THz.

SUMMARY OF THE INVENTION

It is an object of the invention to provide a method and apparatus for generating high-level, multi-octave, millimeter- and submillimeter-wave noise across a broad frequency range.

According to an embodiment of the invention, a millimeter- and submillimeter-wave noise generator comprises: a microwave noise source; one or more amplifiers for amplifying the microwave noise; a level-set attenuator for setting the microwave noise power to a designated power level; and a frequency multiplier for converting the amplified microwave noise into millimeter- and submillimeter-wave noise.

In another embodiment of the invention, a process for generating millimeter- and submillimeter-wave noise generator comprises the steps of: producing broadband, low-level microwave noise power; amplifying the microwave noise power into high-level noise power; attenuating, if necessary, the high-level, broadband noise power to a power less than a maximum safe input power level of a frequency multiplier; converting the high-level microwave noise power to millimeter- and submillimeter-wave bands using the frequency multiplier; and matching and directing the output of the frequency multiplier into a waveguide, transmission line, or free space.

An advantage of the invention is that it provides broadband, high-level noise continuously throughout the range of 60 GHz to 1 THz, a region that no other prior art device has been able to provide.

Another advantage of the invention is that millimeter- and submillimeter-wave noise is generated with sufficient power to test and calibrate millimeter- and submillimeter-wave components, perform material evaluation and characterization, and perform FTS.

Other advantages of the invention over the prior art include: superior lifetime, improved stability, the elimination of radiation byproducts, e.g., ultraviolet radiation, that can damage living tissue; the elimination of high power and high voltages necessary to drive the source; and the elimination of wasted excess heat and extreme high temperatures caused by thermal sources.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF PREFERRED EMBODIMENTS

Figure 1:
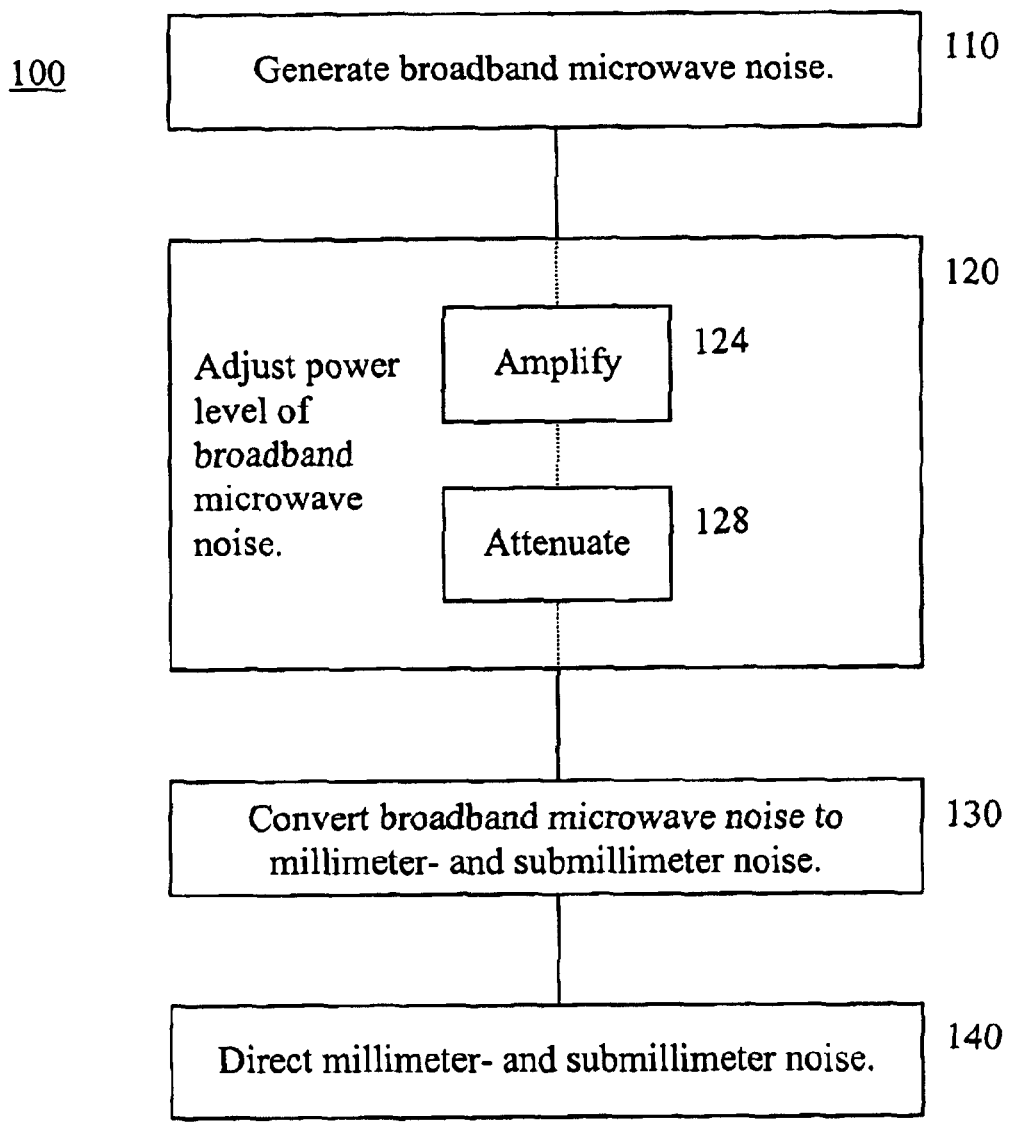
FIG. 1 depicts a method of generating millimeter- and submillimeter-wave noise according to an embodiment of the invention.
Figure 2:
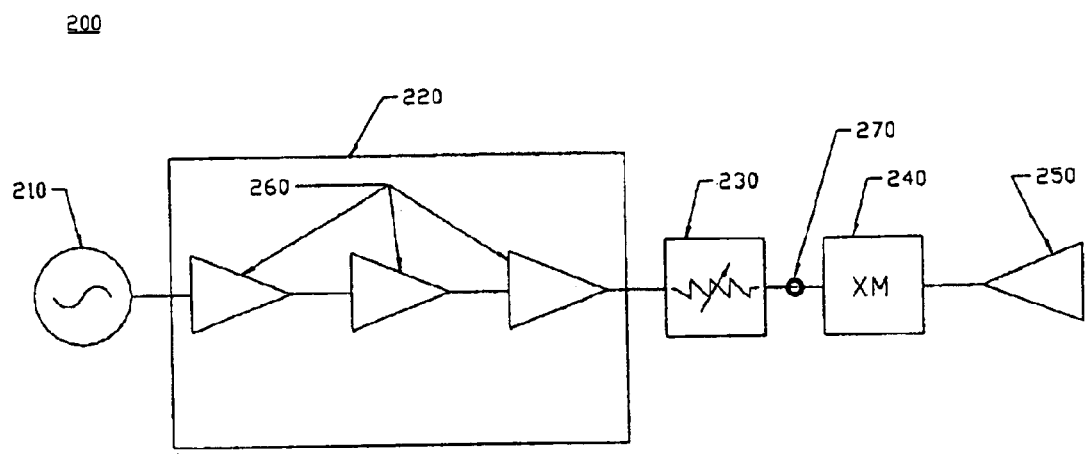
FIG. 2 is a schematic block diagram of a solid-state millimeter- and submillimeter-wave noise source according to a preferred embodiment of the invention.
Figure 3:
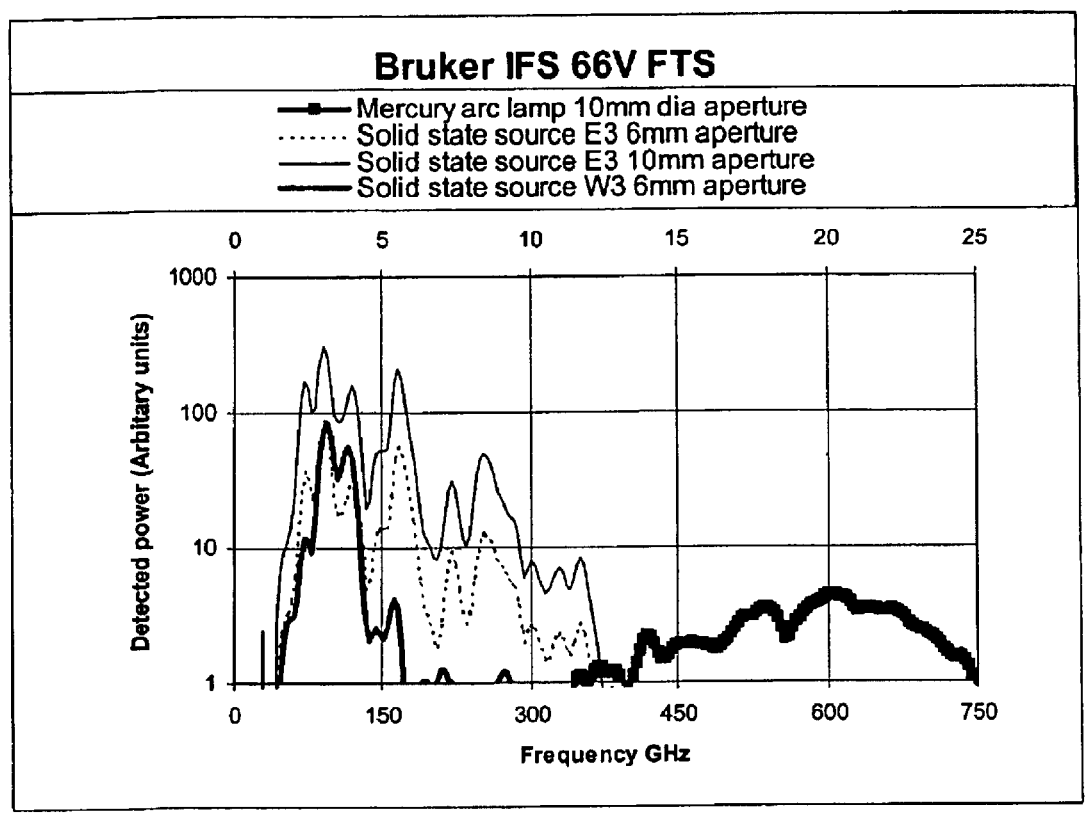
FIG. 3 shows the output noise spectrum of the embodiment of FIG. 2 detected by a Bruker IFS Series Model 66V Fourier Transform Spectrometer, wherein the noise spectrum of a mercury arc lamp is also shown for comparison.

Preferred embodiments of the present invention and their advantages may be understood by referring to FIGS. 1–3 and are discussed in the context of generating high-level, multi-octave, millimeter- and submillimeter-wave noise in an approximate frequency range from about 60 GHz to about 400 GHz (approximately 2 to 13 wave numbers). Nevertheless, the inventive concept can be adapted to generate other frequency ranges of broadband noise, particularly up to 1.2 THz.

In an embodiment of the present invention shown in FIG. 1, method 100 for generating millimeter- and submillimeter-wave noise comprises the steps of producing (step 110) broadband microwave noise power and then converting (step 130) the microwave noise into millimeter- and submillimeter-wave noise bands. The initial microwave noise is generated by a microwave noise source, such as a diode noise source or, alternatively, a noise tube or a thermal noise source having a heated or unheated microwave load. Conversion from microwave noise frequencies into millimeter- and submillimeter-wave noise frequencies occurs by employing a frequency multiplier. Because the conversion efficiency of a typical full-band frequency multiplier is around −10 dB for continuous wave ("CW") signals, the conversion efficiency of the same frequency multiplier for noise is substantially lower.

It may be necessary to adjust (step 120) the input microwave noise power to a suitable level, preferably, at or near the maximum safe input power level of the frequency multiplier for optimum performance. In other words, the input microwave noise power is adjusted to a level high enough to drive the frequency multiplier, but not exceed the damage power level of the multiplier.

Adjustment of the input microwave noise power level can occur prior to conversion by amplifying (sub-step 124) and/or attenuating (sub-step 128) the microwave noise power from the output of the microwave noise source. For example, if the microwave noise power source has an output power level greatly below the maximum safe input power level of the frequency multiplier, one or more microwave amplifiers can be used to adjust the microwave noise power level to the maximum safe input power level. Moreover, a level-set attenuator can be used, either alone or in combination with the amplifier(s), to decrease or set the microwave noise power as necessary. Preferably, the attenuator is used to prevent the input microwave noise power from exceeding a maximum safe input level for the frequency multiplier.

Optionally coupled to the output of frequency multiplier is a waveguide or other transmission device to direct (step 140) the output millimeter- and submillimeter-wave radiated beam toward a desired location.

A noise generating apparatus employing the above method is shown in FIG. 2. Apparatus 200 comprises: a microwave noise source 210, microwave power-amplifier chain 220, level-set attenuator 230, frequency multiplier 240, and transmission structure 250. Solid-state noise source 210 is coupled to power amplifier chain 220. Power amplifier chain 220 comprises one or more microwave amplifiers 260, e.g., three are shown in the figure. Power-amplifier chain 220 is coupled to level-set attenuator 230, which is coupled to frequency multiplier 240. Frequency multiplier 240 is, in turn, optionally coupled to a millimeter-wave transmission structure 250.

In a preferred embodiment, microwave noise source 210 is a solid-state microwave noise source that generates a continuous spectrum of microwave noise from about 0.1 to about 60 GHz at a noise power level about 14 dB Excess Noise Ratio ("ENR") and a corresponding noise temperature of approximately 7000° K. This low-level microwave noise power is then amplified by microwave power-amplifier chain 220. If frequency multiplier 240 has a maximum input power of 20 dBm, then three microwave amplifiers 260, each having a typical gain of 22 dB and 21 dBm saturated output power at 20–44 GHz (rated for CW signals), connected serially are adequate to supply enough power to drive frequency multiplier 240. However, the microwave noise power should not exceed the damage power level of the multiplier. This is accomplished by adjusting level-set attenuator 230 so that the power level at output port 270 of attenuator 230 does not exceed the maximum safe input power level of frequency multiplier 240. In operation, frequency multiplier 240 driven by this high-level microwave noise power, produces millimeter- and submillimeter-wave noise at the second, third, and higher harmonics of the input noise band. Transmission structure 250, such as a waveguide or waveguide horn, coupled to the multiplier, selectively directs the noise power to where it is needed.

In an alternative embodiment, a harmonic mixer without a local oscillator can be substituted for frequency multiplier 240 to convert microwave noise into millimeter- and submillimeter-wave noise.

FIG. 3 shows the output noise spectrum of apparatus 200 using two different frequency multipliers, e.g., two commercially available CW frequency multipliers (tripler models E3 or W3), detected by a Bruker IFS Series Model 66V Fourier Transform Spectrometer with a 6 or a 10 mm aperture. The output of this device has a non-uniform noise power spectral density and continuously covers a multi-octave band over a range of about 60 to about 400 GHz. This output noise power level is extremely high, i.e., roughly two orders of magnitude higher than the noise emitted from a conventional mercury arc lamp as shown. Maximum power output was measured to be approximately 33 dB ENR. Further shown in the figure is the unexpected and intense noise surprisingly extending to the fourth, fifth, and higher harmonics of the input microwave noise. The power density attained is substantial, e.g., greater than a noise temperature of approximately 2000° K. Comparatively, only the third harmonic contains substantial power and is detectable when a CW signal is used as an input into a frequency tripler.

Apparatus 200 is a compact, portable, efficient, and highly reliable device for generating high-level, multi-octave, millimeter- and submillimeter-wave noise. When constructed from off-the-shelf components, apparatus 200 readily supplies high power noise within the band of about 60 to about 400 GHz. In an alternative embodiment of the invention, one or more of the components may be specifically tailored to generate noise outside this band, e.g., noise of frequencies to and beyond 1 THz. For example, an apparatus comprising an 18 to 110 GHz diode noise source and a 75 to 110 GHz power amplifier chain produces enough noise power to drive a frequency multiplier chain, e.g., a frequency tripler followed by a frequency quadrupler, to generate noise in a frequency region extending to 1.2 THz having a noise temperature (or power spectral density) substantially in excess of that of a black body radiator at 2000° K. Those skilled in the art will recognize that the above embodiment are exemplary only and that the inventive concept can be adapted to generate noise comprising any frequency band or bands within the frequency range of about 60 GHz to about 1.2 THz.

In other embodiments of the invention, apparatus 200 may comprise one or more bandpass filters and/or additional level-set attenuators coupled to the input and/or output of multiplier 240, or after transmission structure 250 or before or between amplifiers 260, to create a more uniform noise power spectral density and/or one or more discrete frequency bands centered at particular frequencies. Moreover, a tuner may be coupled to multiplier 240 to adjust the one or more discrete frequency bands. Further, transmission structure 250 may be enabled to focus the output noise power into an intense beam.

Apparatus 200 generates millimeter- and submillimeter-wave noise at sufficient power to perform FTS, particularly material evaluation and characterization, and test and calibrate millimeter- and submillimeter-wave components. In an embodiment of the invention, apparatus 200 is coupled to a Fourier Transform Spectrometer. For example, transmission structure 250 can direct the output noise of apparatus 200 into a sample region, or intermediate components connected thereto, of the spectrometer. The output noise band of apparatus 200 is particularly suited for replacing or supplementing the broadband noise source, e.g., high-pressure mercury arc lamp, used in the FTS system, thereby creating a previously unexplored frequency band for evaluating and identifying spectroscopic characteristics of materials, and also millimeter- and submillimeter-wave devices and circuits.

In another embodiment of the invention, the output noise of apparatus 200 is used as a broadband test signal for testing and calibrating millimeter- and submillimeter-wave components. For example, apparatus 200 is used in conjunction with a receiver, detector, or a spectral analyzer to measure the power transmitted and/or reflected from a device under test.

The foregoing embodiments show example applications employing the inventive concept. Other millimeter- and submillimeter-wave noise applications include, but are not limited to, antenna testing and calibration, radiometry, testing broadband receivers, radar, auto anti-collision and avoidance, and communication jamming.

Although the invention has been particularly shown and described with reference to several preferred embodiments thereof, it will be understood by those skilled in the art that various changes in form and details may be made therein without departing from the spirit and scope of the invention as defined in the appended claims.

We claim:

1. A millimeter- and submillimeter-wave noise apparatus for generating millimeter- and submillimeter-wave noise, without a local oscillator, wherein said millimeter- and submillimeter-wave noise comprises a continuum of random noise in the range between about 60 GHz and about 1.2 THz comprising:

a microwave noise source;

a frequency multiplier that accepts a designated power level from said microwave noise source and produces millimeter- and submillimeter-wave noise, wherein said designated power level is no higher than a maximum safe input power level for said frequency multiplier; and a transmission structure.

2. The apparatus of claim 1, wherein said millimeter- and submillimeter-wave noise comprises one or more continuous frequency bands in the range from about 60 GHz to 110 GHz.

3. The apparatus of claim 1, wherein said millimeter- and submillimeter-wave noise comprises one or more continuous frequency bands in the range from about 60 GHz to about 400 GHz.

4. The apparatus of claim 1, wherein said millimeter- and submillimeter-wave noise comprises one or more continuous frequency bands in the range from about 400 GHz to about 1.2 THz.

5. The apparatus of claim 1, wherein said noise source further comprises a harmonic mixer.

6. The apparatus of claim 1, wherein said apparatus is portable.

7. A spectrometer comprising the apparatus of claim 3.

8. The spectrometer of claim 7, wherein said spectrometer is a Fourier Transform Spectrometer.

9. A method of producing millimeter- and submillimeter-wave noise, without a local oscillator, comprising:

generating a first noise band having a designated power level;

inputting said first noise band into a frequency multiplier, wherein said designated power level is a maximum safe input power level of said frequency multiplier; and converting said first noise band into a second noise band, wherein said second noise band comprises a continuum of random millimeter- and submillimeter-wave noise.

10. The method of claim 9, wherein said second noise band is continuous across a range of frequencies from about 60 GHz to about 400 GHz.

11. The method of claim 9, wherein said second noise band is continuous across a range of frequencies from about 60 GHz to about 1 THz.

12. The method of claim 9, wherein said first noise band comprises noise of frequencies between about 0.1 GHz to about 60 GHz.

13. The method of claim 9, further comprising adjusting said first noise band to the designated power level prior to said converting step.

14. The method of claim 9, wherein the millimeter- and submillimeter-wave noise has a noise power level that is at least two orders of magnitude higher than noise power emitted from a mercury arc lamp.

15. The method of claim 13, wherein said adjusting step comprises amplifying a power of said first noise band.

16. The method of claim 13, wherein said adjusting step comprises attenuating a power of said first noise band.

17. The method of claim 9, further comprising directing said second band of noise toward a destination.

18. A millimeter- and submillimeter-wave noise generating apparatus comprising:

a microwave noise source for generating microwave noise;

an adjustment device for adjusting a power of said microwave noise source to a designated level; and a frequency multiplier for converting said adjusted microwave noise into a continuum of millimeter- and submillimeter-wave noise, wherein said designated level is a maximum safe input level of said frequency multiplier and wherein the millimeter and submillimeter noise is generated without a local oscillator.

19. The apparatus of claim 18, wherein said adjustment device comprises one or more microwave amplifiers.

20. The apparatus of claim 19, wherein said adjustment device further comprises a level-set attenuator.

21. The apparatus of claim 18, wherein said millimeter- and submillimeter-wave noise comprises one or more continuous frequency bands across a frequency range of about 60 GHz to about 400 GHz.

22. The apparatus of claim 18, wherein said millimeter- and submillimeter-wave noise comprises one or more continuous frequency bands across a frequency range of about 60 GHz to about 1 THz.

23. The apparatus of claim 18, further comprising a transmission structure coupled to an output of said frequency multiplier for directing said millimeter- and submillimeter-wave noise.

24. The apparatus of claim 18, wherein said microwave noise source is selected from the group consisting of: a diode noise source, a noise tube, and a thermal noise source.

25. The apparatus of claim 18, wherein said frequency multiplier is a semiconductor diode multiplier.

26. The apparatus of claim 18, wherein said apparatus is portable.

27. The apparatus of claim 18, further comprising one or more band-pass filters coupled to said frequency multiplier to create one or more discrete millimeter- and submillimeter-wave noise bands.

28. A spectrometer comprising said apparatus of claim 18.

29. A method for generating millimeter and submillimeter-wave noise power, without a local oscillator, comprising:

producing microwave noise power;

amplifying said microwave noise power into amplified noise power;

adjusting said amplified noise power to a designated power level; and converting said adjusted noise power to a continuum of millimeter- and submillimeter-wave noise through a frequency multiplier, wherein said designated power level is the maximum safe input level of said frequency multiplier.

30. The method of claim 29, further comprising testing millimeter- and submillimeter-wave components using said millimeter- and submillimeter-wave noise.

31. The method of claim 29, further comprising:

directing said millimeter and submillimeter noise from said frequency multiplier into a Fourier Transform Spectrometer; and performing Fourier Transform Spectrometry on a test sample.

32. The method of claim 29, further comprising characterizing materials using said millimeter- and submillimeter-wave noise.

33. The method of claim 29, wherein said millimeter- and submillimeter-wave noise is continuous across the frequency range between about 60 GHz to about 400 GHz.

34. The method of claim 29, wherein said millimeter- and submillimeter-wave noise is continuous across the frequency range between about 60 GHz to about 1 THz.

35. A noise generator for generating noise without a local oscillator, wherein said noise has a noise temperature greater than 2000°K. and comprises one or more continuous frequency bands in the range consisting essentially between about 60 GHz to about 1.2 THz comprising one or more frequency multiplier chains for converting microwave noise into said noise; and a transmission structure.

36. The apparatus of claim 1, wherein the output noise has a noise power level that is at least two orders of magnitude higher than said millimeter- and submillimeter-wave noise power emitted from a mercury arc lamp.

* * * * *

UNITED STATES PATENT AND TRADEMARK OFFICE
CERTIFICATE OF CORRECTION

| | | |
|---|---|---|
| PATENT NO. | : 6,844,786 B2 | Page 1 of 1 |
| APPLICATION NO. | : 09/932977 | |
| DATED | : January 18, 2005 | |
| INVENTOR(S) | : Pan et al. | |

It is certified that error appears in the above-identified patent and that said Letters Patent is hereby corrected as shown below:

In the specification,

Col. 1, line 4, before "Field of the Invention" should read:

--RIGHTS IN THE INVENTION

This invention was made with government support under Cooperative Agreement AST-9223814, between the National Science Foundation and Associated Universities, Inc., and, accordingly, the United States government has certain rights in this invention.--

Signed and Sealed this
Twenty-first Day of April, 2015

Michelle K. Lee
*Director of the United States Patent and Trademark Office*